(12) United States Patent
Ye

(10) Patent No.: US 11,232,999 B2
(45) Date of Patent: Jan. 25, 2022

(54) CHIP PACKAGE STRUCTURE AND METHOD FOR FORMING CHIP PACKAGE

(71) Applicant: Silergy Semiconductor Technology (Hangzhou) LTD, Hangzhou (CN)

(72) Inventor: Jiaming Ye, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/792,251

(22) Filed: Feb. 16, 2020

(65) Prior Publication Data

US 2020/0185311 A1 Jun. 11, 2020

Related U.S. Application Data

(63) Continuation of application No. 15/167,215, filed on May 27, 2016, now Pat. No. 10,615,106.

(30) Foreign Application Priority Data

May 28, 2015 (CN) .......................... 201510283826.8

(51) Int. Cl.
*H01L 23/495* (2006.01)
*H01L 21/56* (2006.01)
(Continued)

(52) U.S. Cl.
CPC .... *H01L 23/49575* (2013.01); *H01L 21/4853* (2013.01); *H01L 21/568* (2013.01); *H01L 21/78* (2013.01); *H01L 23/3114* (2013.01); *H01L 23/3128* (2013.01); *H01L 23/49541* (2013.01); *H01L 23/5389* (2013.01); *H01L 24/09* (2013.01); *H01L 24/19* (2013.01); *H01L 24/96* (2013.01); *H01L 23/49816* (2013.01); *H01L 2224/0231* (2013.01); *H01L 2224/12105* (2013.01); *H01L 2924/18162* (2013.01)

(58) Field of Classification Search
None
See application file for complete search history.

(56) References Cited

U.S. PATENT DOCUMENTS

2010/0273296 A1 10/2010 Lee et al.
2012/0032314 A1* 2/2012 Chen .................. H01L 23/3135
257/666

(Continued)

FOREIGN PATENT DOCUMENTS

CN 103633056 A 3/2014
CN 103730444 A 4/2014
(Continued)

*Primary Examiner* — Steven B Gauthier

(57) ABSTRACT

The present disclosure relates to a chip package structure and a method for forming a chip package. A package unit is formed from the chip and an encapsulant surrounding the chip to have an increased area. A redistribution layer is formed on the package unit to draw out to and redistribute input/output terminals on a surface of the chip. The redistribution layer is then electrically coupled to a leadframe or a printed circuit board by external and electrical connectors. The method and the package structure are suitable for providing a chip package having input/output terminals with high density, reducing package cost, and improving package reliability.

8 Claims, 2 Drawing Sheets

(51) Int. Cl.
*H01L 23/00* (2006.01)
*H01L 23/538* (2006.01)
*H01L 23/31* (2006.01)
*H01L 21/48* (2006.01)
*H01L 21/78* (2006.01)
H01L 23/498 (2006.01)

(56) References Cited

U.S. PATENT DOCUMENTS

| | | |
|---|---|---|
| 2013/0001776 A1 | 1/2013 | Yu et al. |
| 2015/0091171 A1 | 4/2015 | Wachter et al. |
| 2015/0162271 A1 | 6/2015 | Ye |
| 2015/0214200 A1 | 7/2015 | Tan et al. |
| 2016/0113144 A1 | 4/2016 | Ye et al. |
| 2016/0225687 A1 | 8/2016 | Kim et al. |
| 2018/0090465 A1* | 3/2018 | Chen .................. H01L 24/97 |

FOREIGN PATENT DOCUMENTS

| | | |
|---|---|---|
| CN | 104269385 A | 1/2015 |
| CN | 104617058 A | 5/2015 |

\* cited by examiner

CHIP PACKAGE STRUCTURE AND METHOD FOR FORMING CHIP PACKAGE

CLAIM OF PRIORITY

This application is a continuation of the following application, U.S. patent application Ser. No. 15/167,215, filed on May 27, 2016, and which is hereby incorporated by reference as if it is set forth in full in this specification, and which also claims priority to Chinese Application No. 201510283826.8, filed on May 28, 2015, which is hereby incorporated by reference in its entirety.

BACKGROUND OF THE DISCLOSURE

Field of the Disclosure

The present disclosure generally relates to the field of a chip package, and more particularly, to a chip package structure and a method for forming a chip package.

Description of the Related Art

A conventional method for forming a chip package includes the steps of singulating chips by cutting a wafer, attaching each chip to a leadframe, electrically coupling input/output pads on the chip to the leadframe by metal wires, and encapsulating the chip to form a chip package. Such method of forming the chip package by using bonding wires is not suitable for forming a chip package having input/output (I/O) terminals with a high density, because pins are provided around the chip and pitches between adjacent ones of the pins should be no less than a predetermined value for an encapsulant. The number of pins surrounding the chip can be increased by increasing an area of the chip, in a case that a chip package needs more I/O terminals. Nevertheless, the method will increase manufacture cost of the chip.

To solve the problem, a chip-scale package (i.e. CSP package) and a flip-chip package are developed. However, each of solder balls or conductive bumps occupy an area (typically larger than pads) of a surface of a chip. In a case that I/O terminals on the surface of the chip increases, the pitches between adjacent ones of the pads of the I/O terminals decrease to a value which is too small to form the solder balls or the conductive bumps on the pads for electrical connection. Thus, the CSP package and the flip-chip package still do not satisfy the requirement of the chip package with I/O terminals having ultra-high density.

BRIEF DESCRIPTION OF THE DISCLOSURE

In view of this, the present disclosure provides a new method for forming a chip package and a new chip package structure for meeting the requirement of the chip package with I/O terminals having ultra-high density.

A method for forming a chip package, comprises:
singulating a chip from a wafer and providing pads of input/output terminals on an active surface of the chip;
adhering the chip to a planar pad with the active surface facing upward;
filling spaces between adjacent ones of the plurality of chips with an encapsulant by a molding process, so that each of the plurality of chips and the encapsulant surrounding it form a package unit;
forming an insulating layer having openings on the package unit, wherein each of the openings at least exposes a portion of each of the plurality of pads;
forming a redistribution layer on the insulating layer which contacts exposed portion of each of the plurality of pads to redistribute the input/output terminals; and
electrically coupling the redistribution layer to a leadframe or a printed circuit board by external and electrical connectors.

Preferably, before electrically coupling the redistribution layer to the leadframe or the printed circuit board by the external and electrical connectors, the method further comprises forming the external and electrical connectors on the redistribution layer, cutting the encapsulant between the adjacent ones of the plurality of chips, and separating the package unit from the plate.

Preferably, the external and electrical connectors are solder balls, and the redistribution layer of the package unit is electrically coupled to the printed circuit board with the solder balls.

Preferably, before forming the solder balls, the method further COMPOSES forming a protection layer on the redistribution layer and which exposes portions of the redistribution layer for forming the solder balls.

Preferably, the electrical and electrical connectors are conductive bumps, and the redistribution layer of the package unit is electrically coupled to the leadframe with the conductive bumps.

Preferably, the external and electrical connectors are metal wires for electrically coupling the redistribution layer to the leadframe, and after forming the redistribution layer and before electrically coupling the redistribution layer to the leadframe by the metal wires, the encapsulant is cut between the adjacent ones of the plurality of chips, and the package unit is separated from the plate.

Preferably, the encapsulant covers the package unit and the leadframe in the molding process.

Preferably, two adjacent ones of the input/output terminals have a pitch smaller than 120 micrometers.

A package structure, comprises:
a plurality of chips having a plurality of pads of input/output terminals on an active surface of each chip;
an encapsulant surrounding each of the plurality of chips;
an insulating layer at least partially covering the active surface and having openings with each opening at least exposing a portion of each of the plurality of pads; and
a redistribution layer on the insulating layer and contacting exposed portion of each of the plurality of pads to redistribute the input/output terminals.

Preferably, the package structure further comprises external and electrical connectors, each of which has one end being electrically coupled to the redistribution layer and the other end being electrically coupled to a leadframe and a printed circuit board.

Thus, in the chip package structure and the method for forming a chip package according to the present disclosure, a package unit is formed from the chip and an encapsulant surrounding the chip to have an increased area. A redistribution layer is formed on the package unit to draw out and redistribute input/output terminals on a surface of the chip. The redistribution layer is then electrically coupled to a leadframe or a printed circuit board by external and electrical connectors. The method and the package structure are suitable for providing a chip package having input/output terminals with high density, reducing package cost, and improving package reliability.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF EMBODIMENTS OF THE DISCLOSURE

Figure 1:
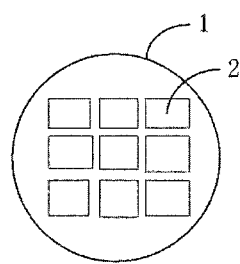
FIG. 1 is a schematic diagram showing an example structure of a wafer structure having chips formed therein.

Exemplary embodiments of the present disclosure will be described in more details below with reference to the accompanying drawings. In the drawings, like reference numerals denote like members. The figures are not drawn to scale, for the sake of clarity. Moreover, some well known parts may not be shown. For simplicity, the package structure having been subject to several relevant process steps may be shown in one figure. Some particular details of the invention will be described, such as an exemplary structure, material, dimension, process step and fabricating method of the device, for a better understanding of the present invention. However, it can be understood by one skilled person in the art that these details are not always essential for but can be varied in a specific implementation of the disclosure.

According to an embodiment of the present disclosure, there is provided a method for forming a chip package, including the following steps.

In step 1, chips are singulated to be individual ones by cutting a wafer.

FIG. 1 is a structural diagram showing an example wafer structure having chips therein. The wafer 1 is typically a silicon wafer, with electronic devices and circuits formed therein. Each silicon wafer includes a plurality of chips 2 with an active surface, the active surface is provided with a pad (not shown in FIG. 1) of a plurality of input/output terminals (I/O terminals). The I/O terminals may be arranged with high density. For example, two adjacent ones of the I/O terminals may have a pitch smaller than 120 micrometers, or preferably 100 micrometers, or preferably 80 micrometers, or preferably 50 micrometers, or the like. The I/O terminals are arranged in high density to increase integration level of the chip.

In step 2, after cutting the wafer, the chips having been separated from each other are attached to a plate with active surfaces facing upward.

Figure 2:
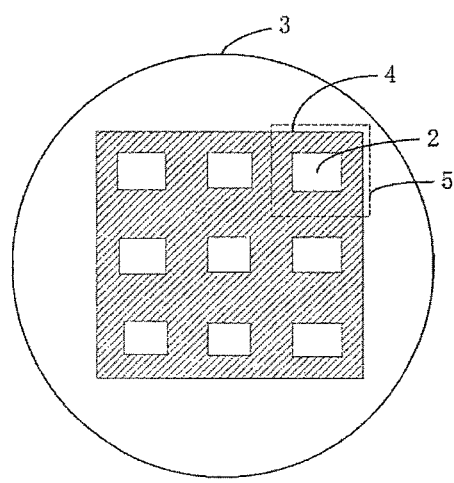
FIG. 2 is a schematic diagram showing an example structure after the chips are attached to a plate.

FIG. 2 is a schematic diagram showing an example structure after the chips are attached to the plate. The chips 2 are arranged on the plate 3, with a pitch between two adjacent ones, for example, ¼~¾ of a width (or a length) of the chip. Each of the chips 2 has an active surface facing upward and a back surface (non-active surface) attached to the plate 3 so THAT the chips 2 are secured on the plate with a predetermined pitch. The plate 3 may be a metal one which can be easily separated from an encapsulant, or a film (for example, a glue film) which is stretched on a hard ring.

In step 3, an encapsulant is filled into spaces between adjacent ones of the plurality of chips by a molding process, so that each of the plurality of chips 2 and the encapsulant surrounding it form a package unit.

Figure 3:
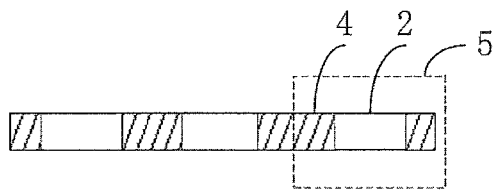
FIG. 3 is a cross-sectional view showing an example structure after encapsulating the chips which have been attached to the plate.

The package structure formed after the molding process is shown in FIG. 2. The encapsulant 4 fills spaces between adjacent ones of the chips 2 by the following steps. A molding module is placed on the chips 2 to cover the chips 2, with a bottom of the molding module contacting the active surfaces of the chips 2. An encapsulant 4 is injected between the molding module and the plate so that the encapsulant 4 fills spaces between adjacent ones of the chips 2. That is, the encapsulant surrounds all of the chips 2. It should be noted that the after the molding process, the encapsulant 4 solidifies and has an upper surface typically not higher than the active surfaces of the chips 2 and a lower surface attached to the plate. The chips 2 are embedded in the encapsulant 4. The encapsulant may be epoxy resin, or similar insulating materials which can be easily separated from the plate 3. The encapsulant 4 surrounds each of the chips 2 after the molding process. Each package unit 5 includes a single chip 2 and a portion of the encapsulant 4 surrounding the chip 2. In each package unit 5, the encapsulant 4 surrounds the chip 2 and contacts side wall of the chip 2, which is a surface perpendicular to the active surface. Preferably, FIG. 3 is a cross-sectional view showing a structure after the molding process, including the encapsulant 4 and the chip 2. As shown in FIG. 3, an upper surface of the encapsulant 4 is coplanar with active surfaces of the chips 2.

Figure 4:
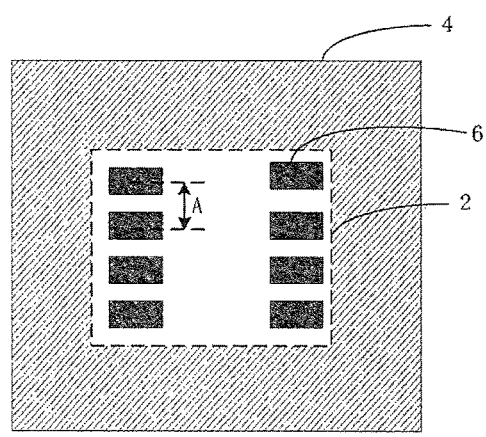
FIG. 4 is an enlarged view showing a package unit in the example structure as shown in FIG. 2.

FIG. 4 is an enlarged view showing the package unit 5 as shown in FIG. 2. As shown in FIG. 4, in the package unit 5, the encapsulant 4 surrounds the chips 2, and has an upper surface which is coplanar with active surfaces of the chips. Thus, an area of the package unit is much larger than those of the chips 2. Input/output terminals of the chips may be redistributed on the surface of the whole package unit, and are then electrically coupled to an external circuit. Thus, the chips 2 may have the input/output terminals with higher density. That is, a pitch of two adjacent ones of the input/output terminals, i.e. a distance A between centers of two adjacent pads 6 as shown in FIG. 4, may be smaller than 120 micrometer, or preferably 100 micrometers, or preferably 80 micrometers, or preferably 50 micrometers, or the like. The I/O terminals are arranged in high density to increase integration level of the chip.

In step 5, an insulating layer is formed on the package unit and has openings with each opening at least exposing a portion of each of the plurality of pads.

In step 6, a redistribution layer is formed on the insulating layer which contacts exposed portion of each of the plurality of pads to redistribute the input/output terminals.

In step 7, the redistribution layer is electrically coupled to a leadframe or a printed circuit board by external and electrical connectors.

Figure 5:
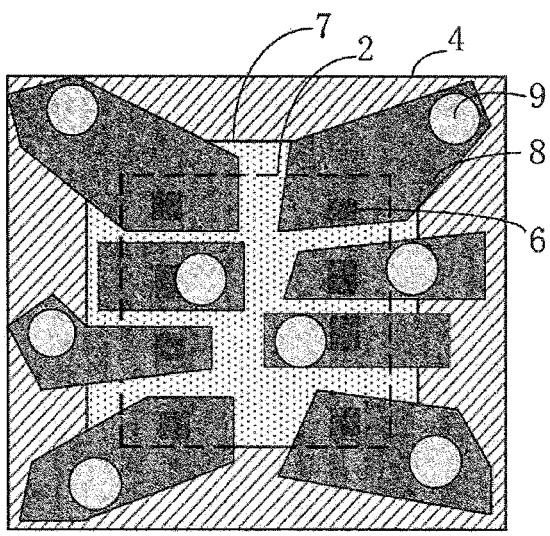
FIG. 5 is a top view showing an example structure after I/O terminals on the active surface of the chip are drawn out to and redistributed on a surface of the package unit.
Figure 6:
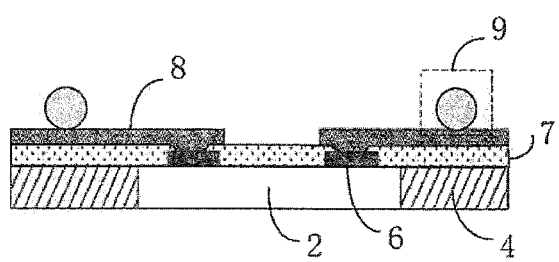
FIG. 6 is a cross-sectional view showing the example structure as shown in FIG. 5 after I/O terminals on the active surface of the chip are drawn out to and redistributed on a surface of the package unit.

FIGS. 5 and 6 are a top view and a cross-sectional view respectively, which show an example structure after I/O terminals on the active surface of the chip are drawn out to and redistributed on a surface of the package unit.

As shown in FIGS. 5 and 6, after the step 4, an insulating layer 7 is formed on surfaces of all of the package units. The insulating layer 7 may be provided at a central portion of each package unit, or extend to the encapsulant of each package unit. Moreover, the insulating layer has openings which expose at least a portion of each pad 6. That is, at least a portion of each pad 6 is exposed. The insulating layer 7 may be a layer of silicon dioxide, or a stack of silicon dioxide and silicon nitride.

After forming the insulating layer, a redistribution layer is formed on the insulating layer, which is a patterned conductive metal layer and shown as the redistribution layer 8 as shown in FIG. 5. The redistribution layer 8 is patterned into a plurality of conductive traces which are separated from each other. Each conductive trace contacts respective one pad 6 to draw out the I/O terminals of the chip 2 to the conductive traces. The conductive traces may extend to the surface of the encapsulant 4, and draw out the I/O terminals to the surface of the encapsulant 4, but not only is located on the chips 2. External and electrical connectors 9 are used for electrically coupling the redistribution layer to a leadframe or a printed circuit board, and have an increased area for arrangement on the package unit, including both an area of the chip and an area of the encapsulant. Thus, more I/O terminals may be drawn out on the package unit. Accordingly, the patterned redistribution layer contacts exposed portions of the pads, for redistributing locations of the input/output terminals, which effectively increases an arrangement area of the I/O terminals. The pitches of the I/O terminals of the chips 2 can be greatly decreased.

In this embodiment, the external and electrical connectors may be solder balls. The method for forming the package structure according to an embodiment of the present disclosure, before step 7, further includes forming the external and electrical connectors 9 on the redistribution layer, cutting the encapsulant 4 between adjacent ones of the chips 2, and separating each package unit 5 from the plate 3, to form package units which are separated from each other. Then, in step 7, the external and electrical connectors of each package unit are electrically coupled to a leadframe or a printed circuit board to provide electrical connections between the I/O terminals on the chip of the package unit and the external circuit.

Specifically, the external and electrical connectors are solder balls, such as tin solder balls, and the redistribution layer of the package unit is electrically coupled to the printed circuit board with the solder balls after the package unit is separated from the plate. In a preferable embodiment, before forming the solder balls, the method further includes forming a protection layer (not shown in the figure) on the redistribution layer which exposes portions of the redistribution layer for forming the solder balls. Thus, the solder balls are separated from each other with a distance and a short circuit may be avoided.

Moreover, the electrical and electrical connectors may also be conductive bumps, such as Cu bumps, and the redistribution layer of the package unit is electrically coupled to the leadframe with the conductive bumps. After the package unit is electrically coupled to the leadframe, the encapsulant covers the package unit and the leadframe in the molding process. The term "cover" here means incomplete encapsulation, with leads of the leadframe being exposed outside the encapsulant for being electrically coupled to the external circuit.

In other embodiments, the external and electrical connectors may be metal wires, and the redistribution layer is electrically coupled to the leadframe by the metal wires. Thus, the method for forming a package structure according to an embodiment of the present disclosure further includes cutting the encapsulant between the adjacent ones of the plurality of chips, and separating the package unit from the plate, after forming the redistribution layer and before electrically coupling the redistribution layer to the leadframe by the metal wires. After separating the package unit, one end of the metal wire is electrically coupled to the redistribution layer of the package unit, and the other end of the metal wire is electrically coupled to the leadframe, and more particularly to the leads of the leadframe. After the package unit is electrically coupled to the leadframe by the metal wires, the encapsulant covers the package unit and the leadframe in the molding process. The term "cover" here means incomplete encapsulation, with leads of the leadframe being exposed outside the encapsulant for being electrically coupled to the external circuit.

Moreover, according to an embodiment of the present disclosure, there is provided a package structure as shown in FIG. 6. The chip package structure mainly includes a chip 2, an encapsulant 4, an insulating layer 7, a redistribution layer 8, and external and electrical connectors 9, each of which has one end being electrically coupled to the redistribution layer and the other end being electrically coupled to a leadframe and a printed circuit board.

The chip 2 has an active surface provided with pads 6 of input/output terminals. Two adjacent ones of the input/output terminals may have a pitch smaller than 120 micrometers, or preferably 100 micrometers, or preferably 80 micrometers, or preferably 50 micrometers, or the like. The two adjacent ones of the I/O terminals have a pitch which is too small to arrange external and electrical connectors 9 directly on the pads 6.

The encapsulant 4 surrounds the chip 2 and contacts a side wall (i.e. a surface perpendicular to the active surface) of the chip 2, and has a surface which is coplanar with the active surface of the chip, or alternatively, lower than the active surface. Thus, an area of the package unit including the chip 2 and the encapsulant surrounding it is much larger than that of the chip 2. Input/output terminals of the chips may be redistributed on the surface of the whole package unit, and then be electrically coupled to an external circuit. Thus, the chips 2 may have the input/output terminals with higher density.

The insulating layer 7 at least partially covers the active surface and has openings with each opening at least exposing a portion of each of the plurality of pads. In an embodiment, the insulating layer may extend to the encapsulant 4. The insulating layer may be made of silicon dioxide, or the like.

The redistribution layer 8 is arranged on the insulating layer and contacts exposed portion of each of the plurality of pads 6 to redistribute the input/output terminals. The redistribution layer 8 extends to a surface of the encapsulant 4, which increases an area of the external and electrical connectors 9 for arrangement, and an area of the I/O terminals. The chip 2 will be allowed to have I/O terminals with high density. The external and electrical connectors may be on selected form the group consisting of solder balls, conductive bumps, and metal wires.

Thus, in the chip package structure and the method for forming a chip package according to the present disclosure, a package unit is formed from the chip and an encapsulant surrounding the chip to have an increased area. A redistribution layer is formed on the package unit to draw out and redistribute input/output terminals on a surface of the chip. The redistribution layer is then electrically coupled to a leadframe or a printed circuit board by external and electrical connectors. The method and the package structure are suitable for providing a chip package having input/output terminals with high density, reducing package cost, and improving package reliability.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

What is claimed is:

1. A package structure, comprising:
    a chip having a plurality of pads of input/output terminals on an active surface of said chip;
    an encapsulant surrounding said chip, wherein said chip and said encapsulant surrounding said chip together form a package unit, wherein said encapsulant has a surface that is coplanar with or lower than said active surface, and wherein said encapsulant exposes an upper surface and side surfaces of said plurality of pads;
    an insulating layer on said active surface and said encapsulant, and having openings on said package unit, wherein each of said openings exposes at least a portion of each of said plurality of pads, and wherein said insulating layer fully covers said surface of said encapsulant; and
    a redistribution layer on said insulating layer and contacting said exposed portion of each of said plurality of pads to redistribute said input/output terminals.

2. The package structure according to claim 1, further comprising external and electrical connectors, each of which has a first end being electrically coupled to said redistribution layer, and a second end being electrically coupled to a leadframe or a printed circuit board.

3. The package structure according to claim 1, wherein said encapsulant contacts a side wall of said chip.

4. The package structure according to claim 1, wherein a distance between centers of two adjacent pads is not larger than 120 μm.

5. The package structure according to claim 1, wherein said insulating layer is configured as a layer of silicon dioxide, or a stack of silicon dioxide and silicon nitride.

6. The package structure according to claim 2, wherein each of said external and electrical connectors comprises solder balls.

7. The package structure according to claim 6, further comprising a protection layer on said redistribution layer, wherein said protection layer has openings to expose said solder balls.

8. The package structure according to claim 2, wherein each of said external and electrical connectors comprises conductive bumps or metal wires.

* * * * *